United States Patent
Huang

(10) Patent No.: US 6,696,354 B2
(45) Date of Patent: Feb. 24, 2004

(54) METHOD OF FORMING SALICIDE

(75) Inventor: Chao-Yuan Huang, Hsinchu (TW)

(73) Assignee: Silicon Integrated Systems Corp. (TW)

(*) Notice: Subject to any disclaimer, the term of this patent is extended or adjusted under 35 U.S.C. 154(b) by 0 days.

(21) Appl. No.: 10/131,099

(22) Filed: Apr. 25, 2002

(65) Prior Publication Data

US 2003/0228742 A1 Dec. 11, 2003

(51) Int. Cl.$^7$ .............................................. H01L 21/44
(52) U.S. Cl. ................ 438/581; 438/563; 438/592; 438/659; 257/340; 257/570; 257/384; 257/386; 257/388
(58) Field of Search ................. 438/581, 563, 438/592, 659; 257/370, 340, 384, 386, 388

(56) References Cited

U.S. PATENT DOCUMENTS 5,924,001 A * 7/1999 Yang et al. ................. 438/592
6,284,612 B1 * 9/2001 Wu ............................. 438/305

* cited by examiner

Primary Examiner—David Nelms
Assistant Examiner—Reneé R. Berry
(74) Attorney, Agent, or Firm—Birch, Stewart, Kolasch & Birch, LLP

(57) ABSTRACT

A method of forming a salicide. A metal layer is formed on a silicon-based substrate comprising a gate with a spacer on the side wall of the gate and a source/drain is provided. Next, a first thermal treatment is performed to make the portions of the metal layer react with the silicon in the gate and the source/drain to form a salicide. Then, any unreacted metal and the spacer are removed. An ion containing silicon is introduced into the source/drain. Finally, a second thermal treatment is performed.

15 Claims, 7 Drawing Sheets

METHOD OF FORMING SALICIDE

BACKGROUND OF THE INVENTION

1. Field of the Invention

The present invention relates in general to semiconductor manufacturing, and particularly to a method of forming a salicide without consuming the silicon in the substrate such that junction leakage occurs.

2. Description of the Related Art

In semiconductor technology, a Metal-Oxide-Semiconductor transistor comprises a gate and a source/drain. The gate comprising a metal layer and $SiO_2$ is deposited on a silicon-based substrate. Most of the metal has bad adhesion with $SiO_2$. Thus, polysilicon with good adhesion is proposed to replace the metal layer. However, the resistance of polysilicon interconnections is so high that polysilicon is not appropriate as a conductive layer. One way to solve this problem is to form a metal salicide on the polysilicon to enhance the conductivity. As methods of fabricating semiconductor integrated circuits (IC) continually improve, the number of devices that may be introduced into a single semiconductor chip has increased, while the size of each device has decreased. Millions of devices may now be fabricated on a single chip. Therefore, the salicide process is widely applied to ensure shallow junction or ultra shallow junction.

FIGS. 1A–1F are schematic cross-section illustrating steps for forming a salicide of the prior art. In FIG. 1A, a substrate 10 comprises a gate oxide layer 11, a polysilicon gate 12, a source/drain 14, a spacer 20, and a field oxide 22. The substrate 10 is cleaned by HF solution, and a metal layer 30 is formed on the substrate 10 to cover the polysilicon gate 12, the source/drain 14, and the spacer 20, as shown in FIG. 1B. A first rapid thermal process is performed at 650–700° C. in nitrogen atmosphere, and the metal salicide 31 is formed by reacting the portions of the metal in the metal layer 30 with the silicon in the gate 12 as well as in the source/drain 14, as shown in FIG. 1C. The portions of the metal in the metal layer 30 on the spacer 20 and the field oxide 22 remain the same without reacting. Then, a second thermal process is performed at about 800° C. in nitrogen atmosphere, and the phase of the metal salicide 31 is changed to a phase with lower resistance, as shown in FIG. 1E. The salicide process of prior art is accomplished.

The silicon in the source/drain 14 consumes the metal salicide 31 during the salicide process. For example, the reaction follows the following rule when a cobalt salicide is formed: $Co+Si \rightarrow CoSi_2$ The ratio of the thickness of Co:Si:$CoSi_2$ is 1:3.6:3.5. Silicon with about 360 Å thickness will be consumed to form a $CoSi_2$ with about 350 Å thickness. Therefore, 0.04 of the source/drain 14 is lost, and the problem of the junction leakage following occurs, as shown in FIG. 2.

SUMMARY OF THE INVENTION

To solve above problem, it is an object of the present invention to provide a method of forming a salicide to excess consumption of silicon in the substrate.

The method comprises the following steps. First, a silicon-based substrate comprising a gate with a spacer on the side wall of the gate and a source/drain is provided. Next, a metal layer is formed according to the topography of the substrate to cover the gate, the spacer, and the source/drain. A first thermal treatment is performed to react the portions of the metal in the metal layer with the silicon in the gate and the source/drain to form a salicide. Then, the unreacted metal and the spacer are removed. An ion containing silicon is introduced into the source/drain as an extra silicon source for salicide. Finally, a second thermal treatment is performed.

In the preferred embodiment of the present invention, the silicon ion is introduced by ion implantation. The first and second thermal treatment are perferably performed by rapid thermal processes between about 600° C. and 800° C. Besides, the unreacted metal layer and the spacer are removed by etching as is well known.

BRIEF DESCRIPTION OF THE DRAWINGS

The above and other objects, features, and advantages of the present invention will become apparent from the following detailed description of preferred embodiments of the invention explained with reference to the accompanying drawings, in which.

DETAILED DESCRIPTION OF THE PREFERRED EMBODIMENT

There will now be described an embodiment of this invention with reference to the accompanying drawings, FIGS. 3A–3F and FIG. 4.

Figure 1A:
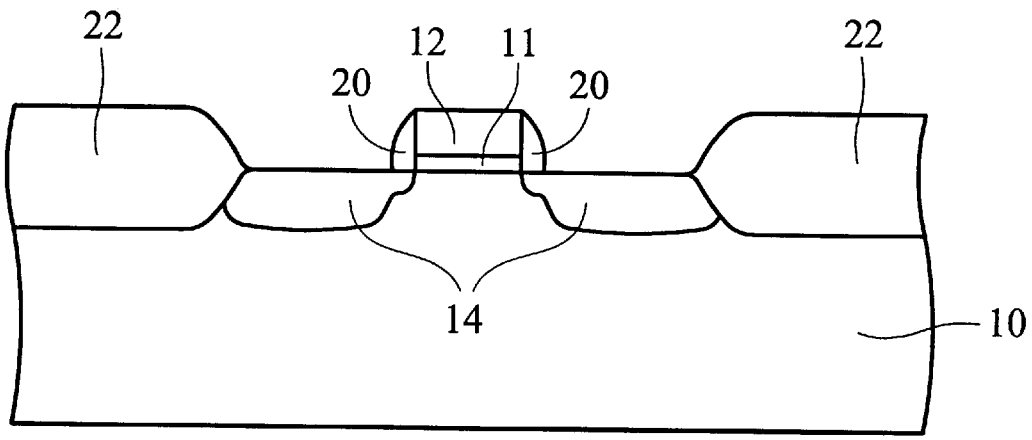
FIGS. 1A–1E are schematic cross-section illustrating steps for forming a salicide according to the prior art.
Figure 1B:
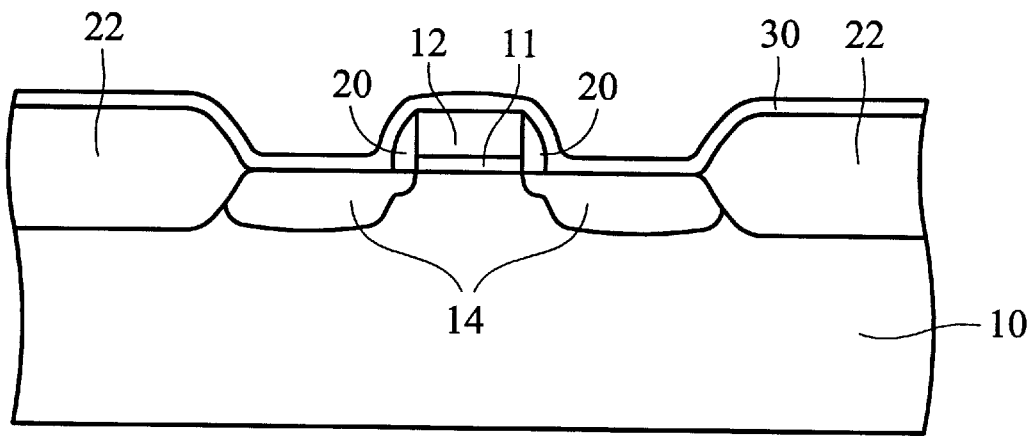
Figure 1C:
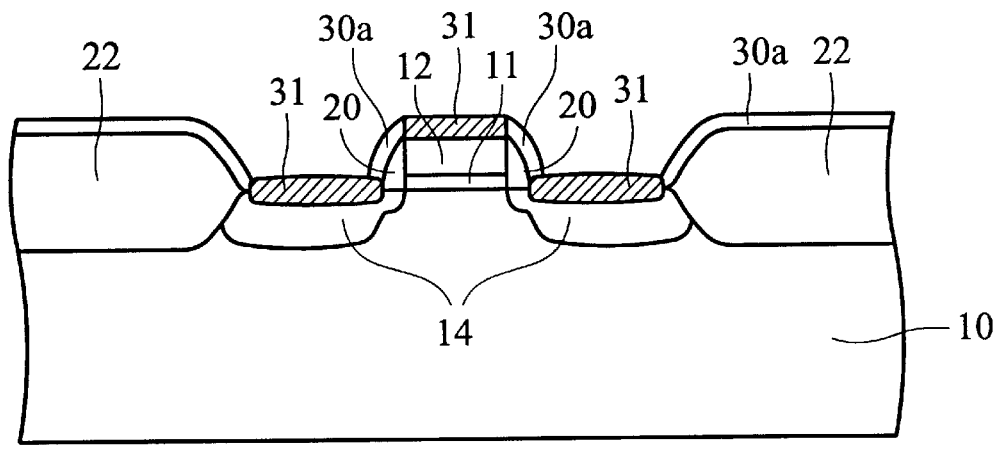
Figure 1D:
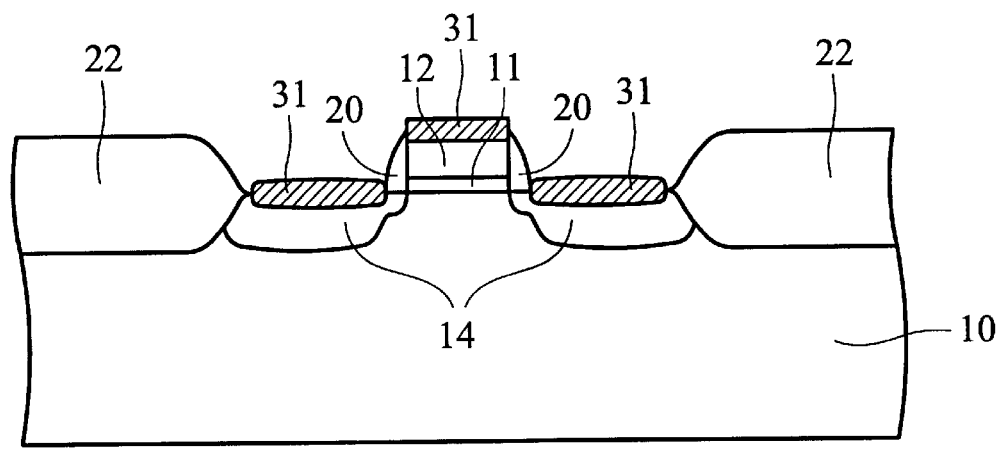
Figure 1E:
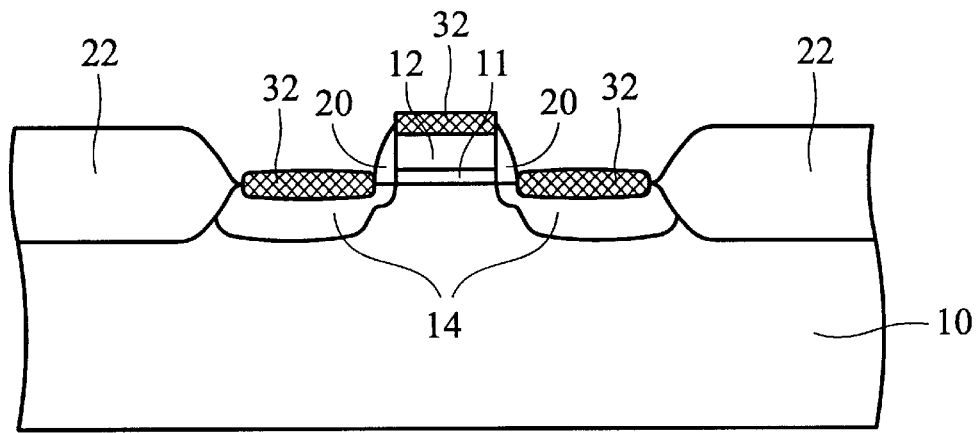
Figure 2:
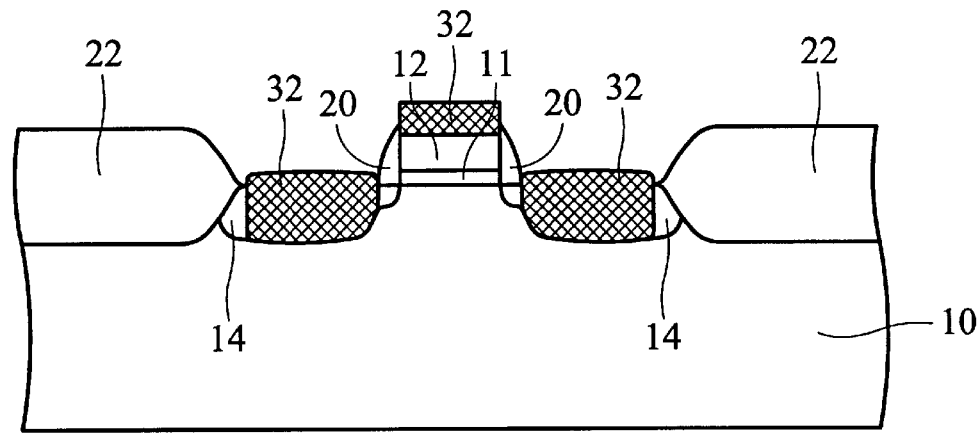
FIG. 2 is a schematic drawing illustrating the junction leakage problem in salicide process according to the prior art.
Figure 3A:
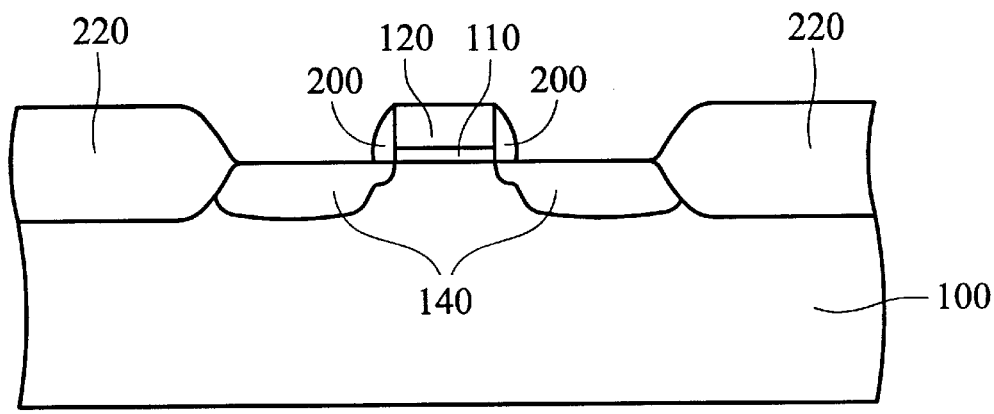
FIGS. 3A–3F are schematic cross-sections illustrating steps for forming a shallow trench according to the preferred embodiment of the invention.

First, in step S600, a silicon-based substrate 100 with primary elements of a MOS transistor is provided, as shown in FIG. 3A. The MOS transistor comprises a gate 120, a source/drain 140 formed by doping, and a field oxide 220 on the silicon-based substrate 100, wherein the material of the gate 120 comprises a polysilicon. There is a spacer 200 on the side wall of the gate 120.

Figure 3B:
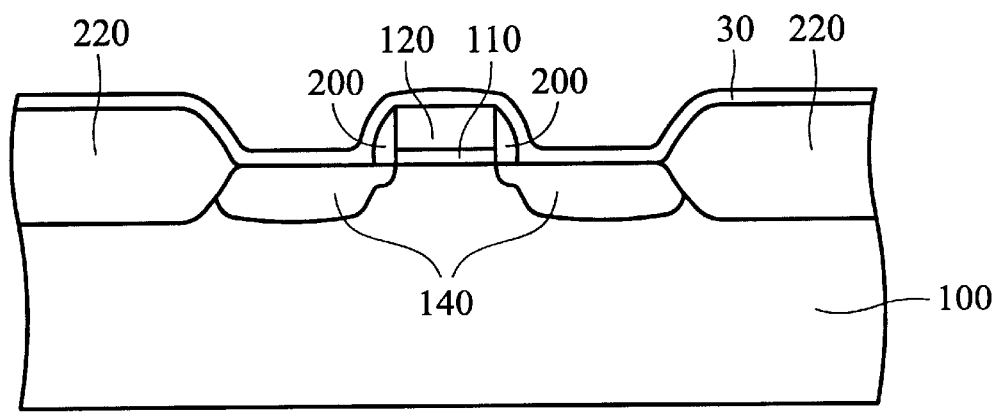

Next, in the step S602, a metal layer 300 is formed according to the topography of the MOS transistor by sputtering to cover the gate 120, the spacer 200, the source/drain 140, and the field oxide 220, as shown in FIG. 3B. The sputter process is preformed by DC plasma. The material of the metal layer 300 comprises a transitional metal, such as titanium (Ti), cobalt (Co), nickel (Ni), or platinum (Pt).

Figure 3C:
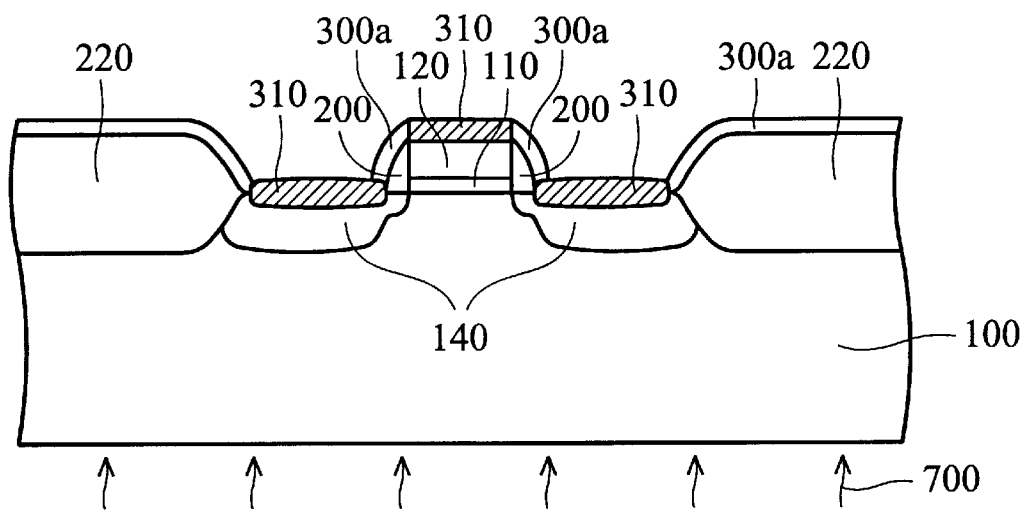

In step S604, a first thermal treatment is preferably performed between about 600° C. and 800° C. by rapid thermal process to make the portions of the metal in the metal layer 300 react with the silicon in the gate 120 and the source/drain 140 to form a salicide, as shown in FIG. 3C. However, the portions of the metal in the metal layer 300 cover the field oxide 220 and the spacer 200 does not react with the silicon in the substrate 100.

Figure 3D:
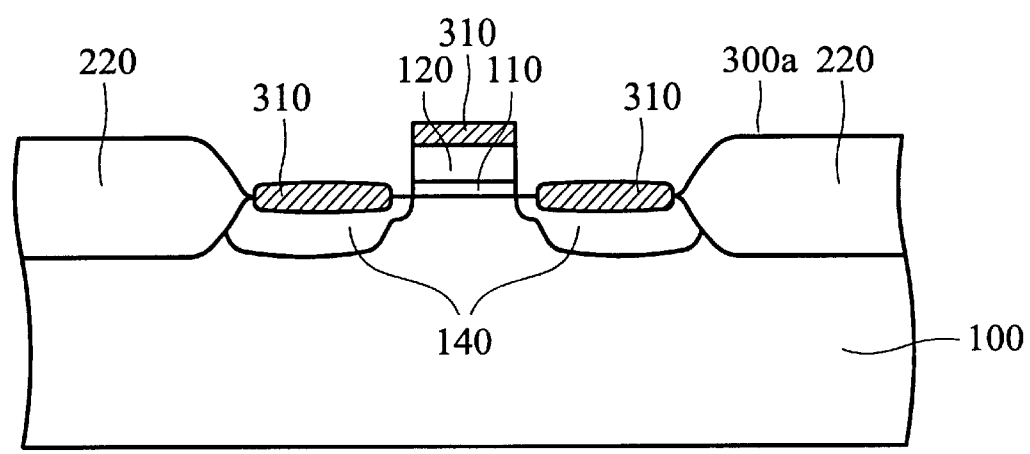

In step S606, any unreacted metal and the spacer 200 are preferably removed by conventional etching, such as wet etching, as shown in FIG. 3D.

Figure 3E:
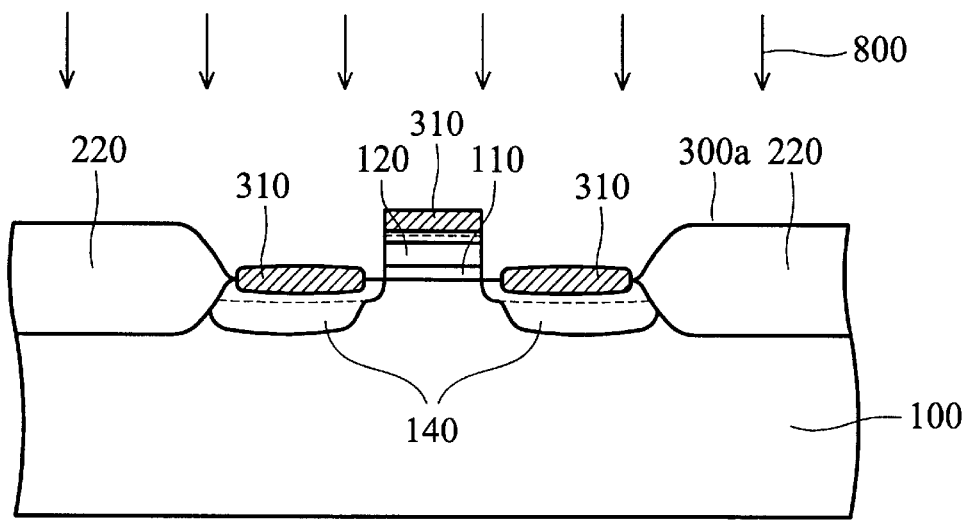

In step S608, an ion containing silicon is introduced into the source/drain 140 by ion implantation as an extra silicon source for salicide, as shown in FIG. 3E.

Figure 3F:
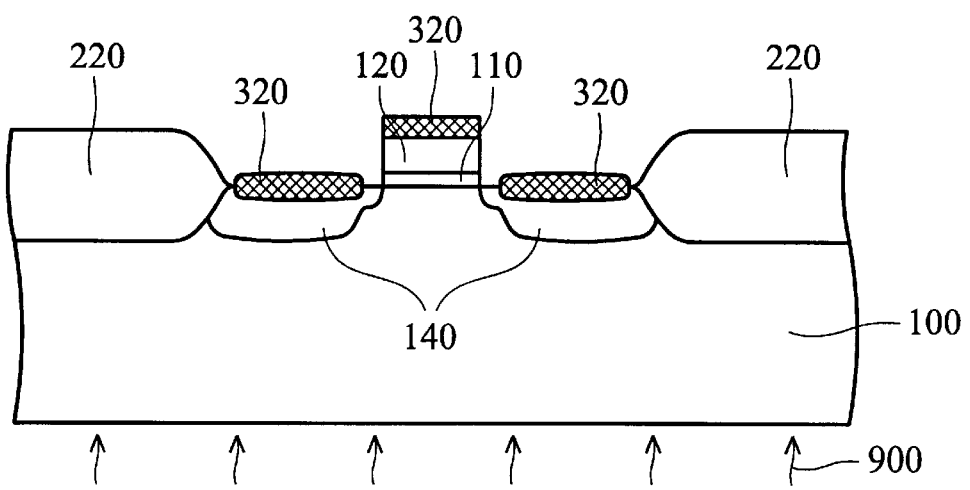
Figure 4:
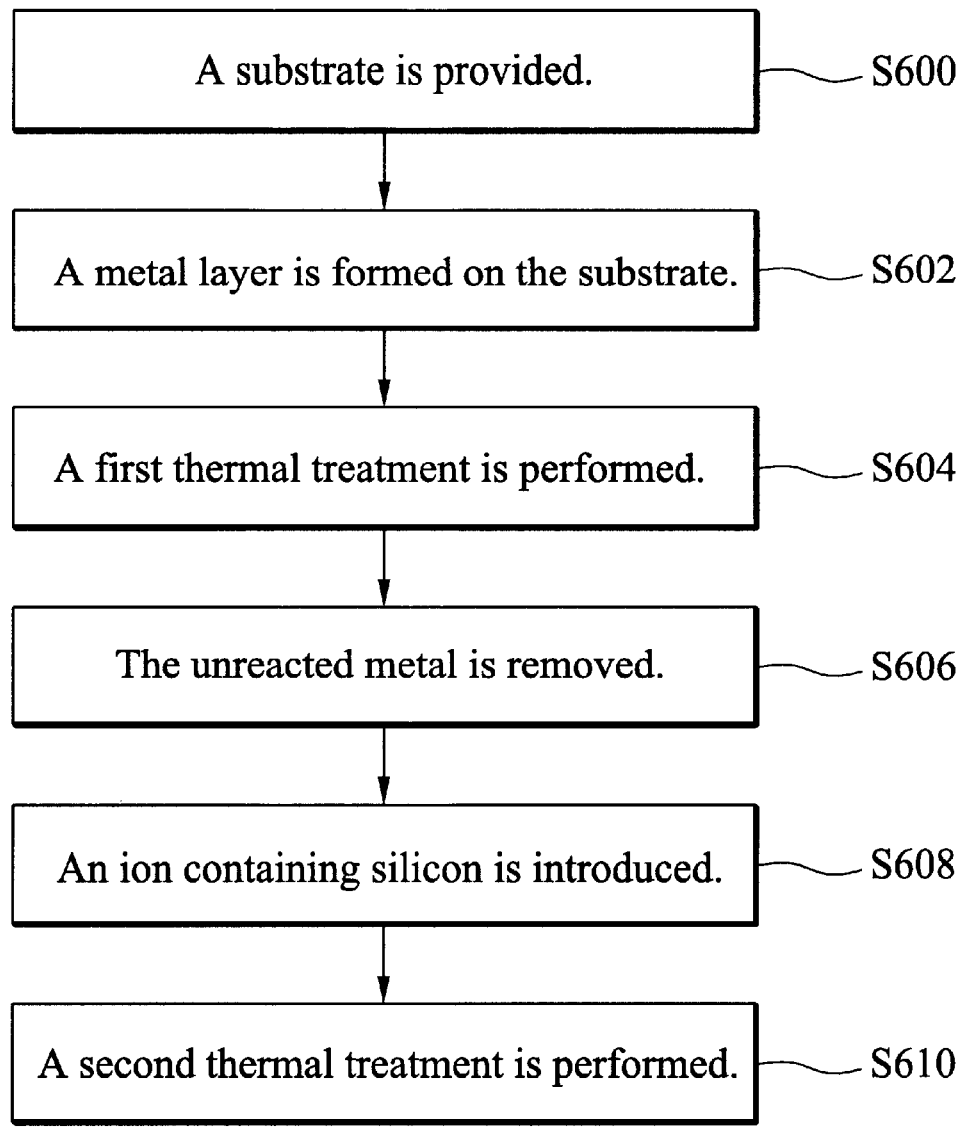
FIG. 4 is a schematic flow chart for forming a shallow trench according to the preferred embodiment of the invention.

In step S610, a second thermal treatment is preferably performed between about 600° C. and 800° C. by rapid thermal process to make, the phase of the salicide 310 change to another phase 320 with low resistance, as shown in FIG. 3F.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method of forming a salicide, comprising:
   providing a silicon-based substrate comprising a source/drain and a gate with a spacer on the side wall of the gate;
   forming a metal layer on the gate, the spacer, and the source/drain;
   performing a first thermal treatment to react the portions of the metal in the metal layer with the silicon in the gate and the source/drain to form a salicide;
   removing any unreacted metal and the spacer;
   introducing an ion containing silicon into the source/drain; and
   performing a second thermal treatment.

2. The method as claimed in claim 1, wherein the material of the metal layer comprises Ti, Co, Ni, or Pt.

3. The method as claimed in claim 1, wherein the first thermal treatment is rapid thermal process (RTP).

4. The method as claimed in claim 1, wherein the second thermal treatment is rapid thermal process (RTP).

5. The method as claimed in claim 1, wherein the silicon ion is introduced by an ion implantation.

6. The method as claimed in claim 1, wherein the metal layer is formed by sputtering.

7. The method as claimed in claim 6, wherein the sputtering is processed by DC plasma.

8. The method as claimed in claim 1, wherein the unreacted metal and the spacer are removed by etching.

9. The method as claimed in claim 1, wherein the silicon-based substrate further comprises a gate oxide below the gate.

10. A method of forming a salicide, comprising:
    providing a silicon-based substrate comprising a gate with a spacer on the side wall of the gate and a source/drain;
    forming a metal layer on the gate, the spacer, and the source/drain;
    performing a first rapid thermal process to react the portions of the metal in the metal layer with the silicon in the gate and the source/drain to form a salicide;
    removing any unreacted metal and the spacer;
    performing a silicon ion implantation process; and
    performing a second rapid thermal process.

11. The method as claimed in claim 10, wherein the material of the metal layer comprises Ti, Co, Ni, or Pt.

12. The method as claimed in claim 10, wherein the metal layer is formed by sputtering.

13. The method as claimed in claim 12, wherein the sputtering is processed by DC plasma.

14. The method as claimed in claim 10, wherein the unreacted metal and the spacer are removed by wet etching.

15. The method as claimed in claim 10, wherein the silicon-based substrate further comprising a gate oxide below the gate.

* * * * *